United States Patent
Buckett et al.

(10) Patent No.: US 10,379,160 B2
(45) Date of Patent: Aug. 13, 2019

(54) SERIAL COMMUNICATION CONTROL

(71) Applicant: ARM LIMITED, Cambridge (GB)

(72) Inventors: Russell John Buckett, Blackburn with Darwen (GB); Ian Craig McFarland, Blackburn with Darwen (GB); Robert John Walker, Blackburn with Darwen (GB)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/692,125

(22) Filed: Aug. 31, 2017

(65) Prior Publication Data
US 2018/0067165 A1  Mar. 8, 2018

(30) Foreign Application Priority Data

Sep. 2, 2016  (GB) .................................. 1614918.9

(51) Int. Cl.
*G06F 13/00* (2006.01)
*G01R 31/3185* (2006.01)
*G06F 13/42* (2006.01)

(52) U.S. Cl.
CPC ............. *G01R 31/318536* (2013.01); *G01R 31/318555* (2013.01); *G01R 31/318594* (2013.01); *G06F 13/00* (2013.01); *G06F 13/4291* (2013.01)

(58) Field of Classification Search
CPC ...... G01R 31/318536; G01R 31/31937; G01R 31/318555; G01R 31/318594; G06F 13/00; G06F 13/4291
See application file for complete search history.

(56) References Cited

U.S. PATENT DOCUMENTS

| 6,397,277 B1 * | 5/2002 | Kato ................. H04L 12/40052 710/104 |
| 6,823,282 B1 * | 11/2004 | Snyder ................ G06F 11/2733 702/120 |
| 9,343,127 B1 * | 5/2016 | Shen ..................... G11C 7/1039 |

OTHER PUBLICATIONS

M. E. S. Elrabaa, "A two-phase return-to-zero (RZ) asynchronous transceiver circuit for pipe-lined SoC interconnects," 2008 International Symposium on System-on-Chip, Tampere, 2008, pp. 1-4.*

(Continued)

*Primary Examiner* — Cynthia Britt
(74) *Attorney, Agent, or Firm* — Nixon & Vanderhye P.C.

(57) ABSTRACT

An apparatus 2 for performing serial data communication with a target device 4, such as an integrated circuit, utilizes serial transfer circuitry 16 to perform a serial transfer of data to a communication register 26 in the target device 4 and serial retrieval circuitry 18 to retrieve an acknowledge signal 32 indicating whether or not the target device is ready to perform further processing following such a transfer. Delay control circuitry 20 serves to apply a predetermined delay period following the transfer of the serial data via the serial transfer circuitry before initiating the retrieval of the acknowledge signal. This predetermined delay period is controlled in dependence upon the ready status indicated by the acknowledge signals retrieved such that the proportion of acknowledge signals retrieved which indicate an unready status meets a predetermined condition, such as being less than a non-zero predetermined value. The serial communication may take place via JTAG serial scan chains and require moving the controlling state machine 14 between a shift state and a capture state.

16 Claims, 4 Drawing Sheets

(56) References Cited

OTHER PUBLICATIONS

Figure 1:
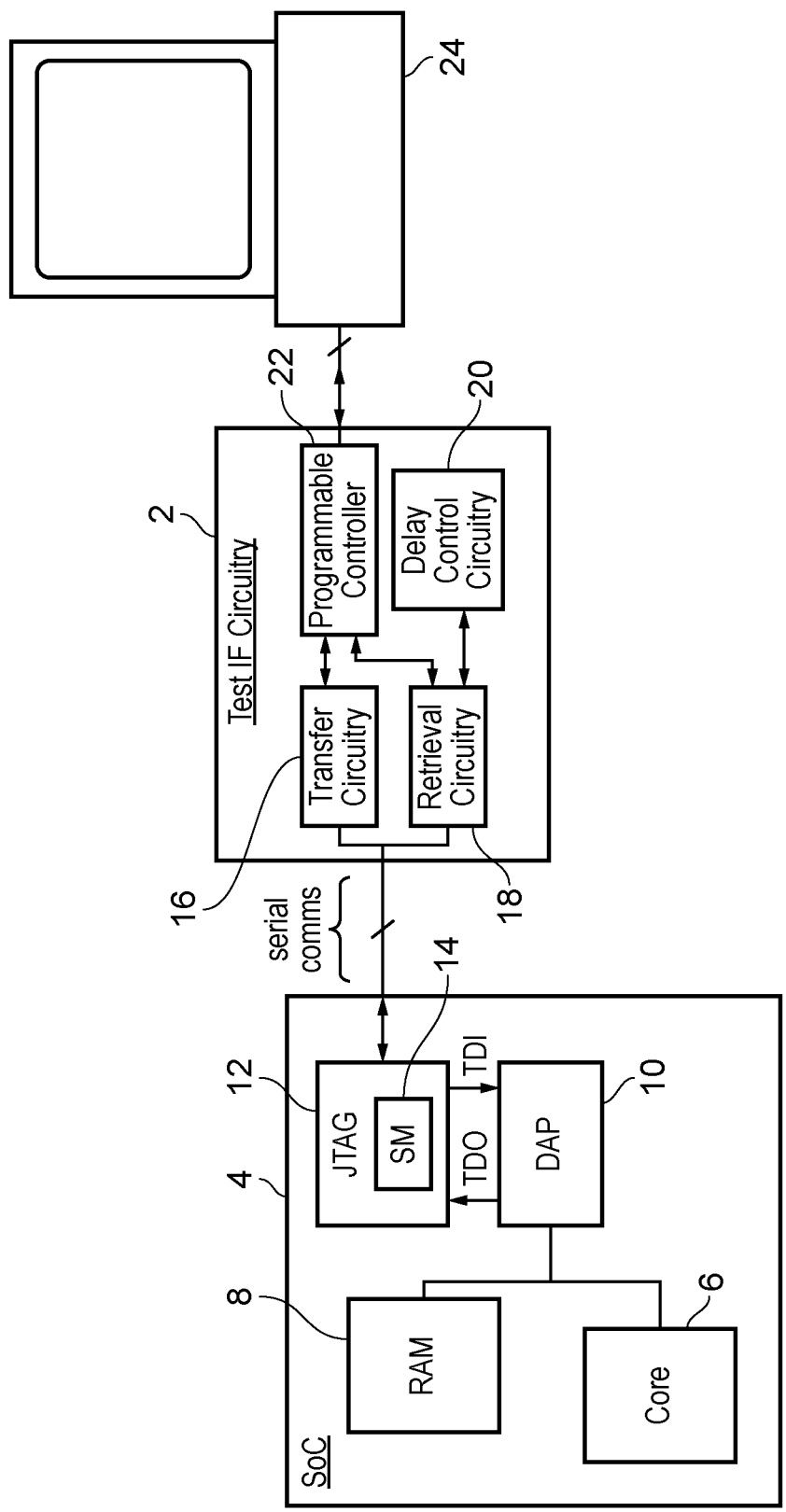

Combined Search and Examination Report for GB 1614918.9, dated Feb. 17, 2017, 12 pages.
Baron Schwartz, 2006, "How to make a program choose an optimal polling interval", xaprb.com, Available from: http://web.archive.org/web/20160406175350/http://www.xaprb.com/blog/2006/05/04/how-to-make-a-program-choose-an-optimal-pollinginterval/, Accessed Feb. 9, 2017, 4 pages.
Wikipedia, 2016, "JTAG", Available from: https://en.wikipedia.org/w/index.php?title=JTAG&oldid=7 1 7117570, Accessed Feb. 9, 2017, 15 pages.
Wikipedia, 2016, "Shift register", Available from: https://en.wikipedia.org/w/index.php?title=Shift_register&oldid=737168082, Accessed Feb. 9, 2017, 3 pages.
Wikipedia, 2016, "Scan chain", Available from: https://en.wikipedia.org/w/index.php?title=Scan_chain&oldid=632712161, Accessed Feb. 9, 2017, 2 pages.
Wikipedia, 2016, "Polling (computer science)", Available from: https://en.wikipedia.org/w/index.php?title=Polling_computer_science)&oldid=732504402, Accessed Feb. 9, 2017, 3 pages.

\* cited by examiner

SERIAL COMMUNICATION CONTROL

This application claims priority to GB Patent Application No. 1614918.9 filed 2 Sep. 2016, the entire contents of which is hereby incorporated by reference.

BACKGROUND

Field

This disclosure relates to the field of data communication. More particularly, this disclosure relates to the control of serial communication.

Description

It is known to provide data processing systems which employ serial data communication. For example, it is known to provide test systems for diagnostic and debug purposes with integrated circuits that use serial scan chains operated in accordance with the JTAG Standards to transfer data to and from a target device in the form of an integrated circuit upon which diagnostic and debug operations are to be performed. As integrated circuits increase in complexity, there are increasing demands upon the diagnostic and debug systems to efficiently transfer increasing volumes of data to and from an integrated circuit which is being subject to diagnostic and debug operations.

SUMMARY

At least some embodiments of the present disclosure provide apparatus for performing serial communication with a target device, said apparatus comprising:
 serial transfer circuitry to transfer serial data with said target device;
 serial retrieval circuitry to retrieve an acknowledge signal from said target device, said serial retrieval circuitry initiating retrieval of said acknowledge signal after a predetermined delay period following said transfer of said serial data, said acknowledge signal indicating a ready status of said target device as one of:
  said target device is ready to perform processing; and
  said target device is unready to perform said processing; and
 delay control circuitry to control said predetermined delay period applied in dependence upon said ready status of one or more retrieved acknowledge signals.

At least some embodiments of the present disclosure provide apparatus for performing serial communication with a target device, said apparatus comprising:
 serial transfer means for transferring serial data with said target device;
 serial retrieval means for retrieving an acknowledge signal from said target device, said serial retrieval means initiating retrieval of said acknowledge signal after a predetermined delay period following said transfer of said serial data, said acknowledge signal indicating a ready status of said target device as one of:
  said target device is ready to perform processing; and
  said target device is unready to perform said processing; and
 delay control means for controlling said predetermined delay period applied in dependence upon said ready status of one or more retrieved acknowledge signals.

At least some embodiments of the disclosure provide a method of performing serial communication with a target device, said method comprising the steps of:
 transferring serial data with said target device;
 initiating retrieval an acknowledge signal from said target device of an acknowledge signal after a predetermined delay period following said transfer of said serial data, said acknowledge signal indicating a ready status of said target device as one of:
  said target device is ready to perform processing; and
  said target device is unready to perform said processing; and
 controlling said predetermined delay period applied by in dependence upon said ready status of one or more retrieved acknowledge signals.

Example embodiments will now be described, by way of example only, with reference to the accompanying drawings in which:

DESCRIPTION OF EMBODIMENTS

Figure 2:
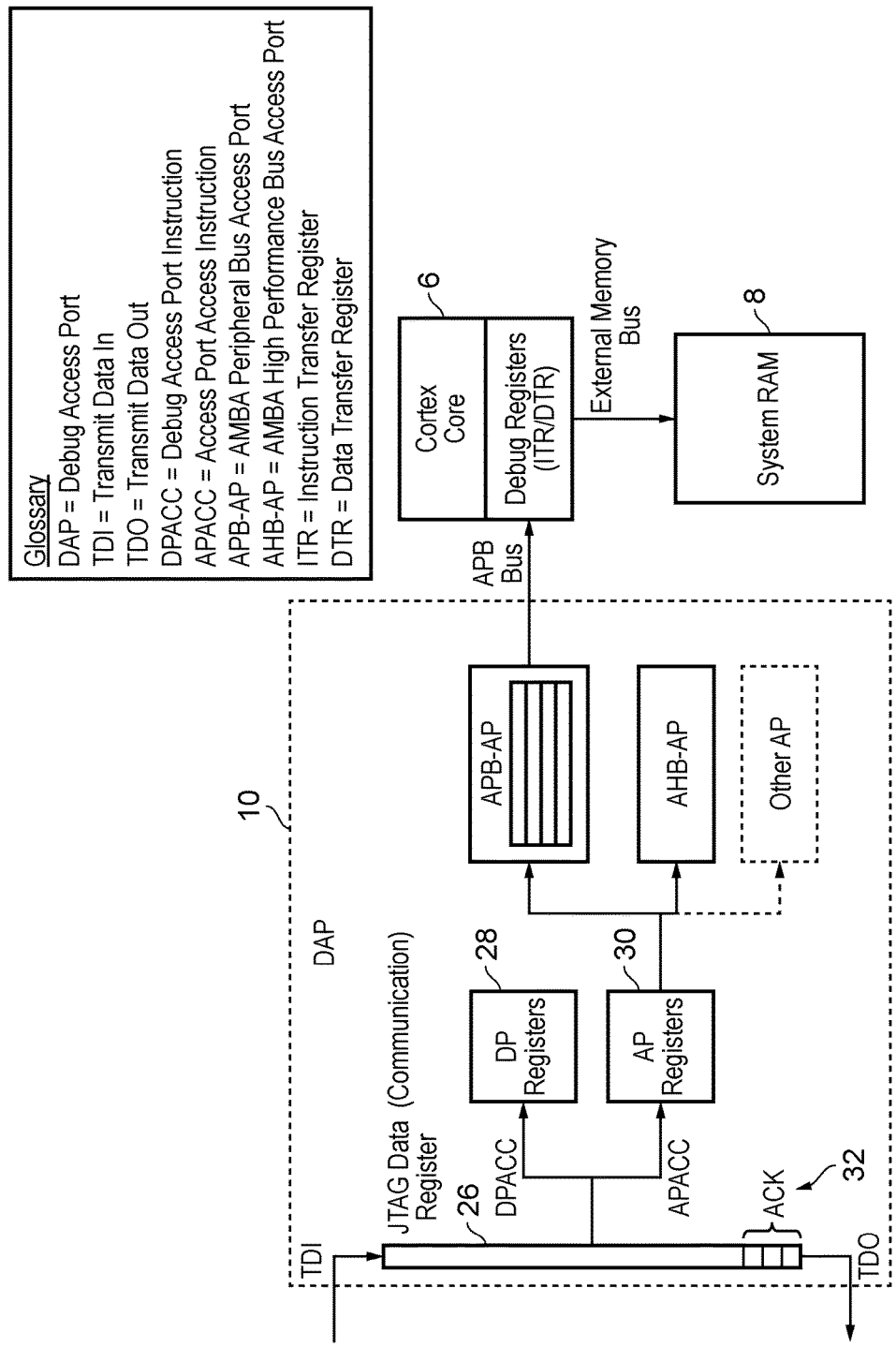
Figure 3:
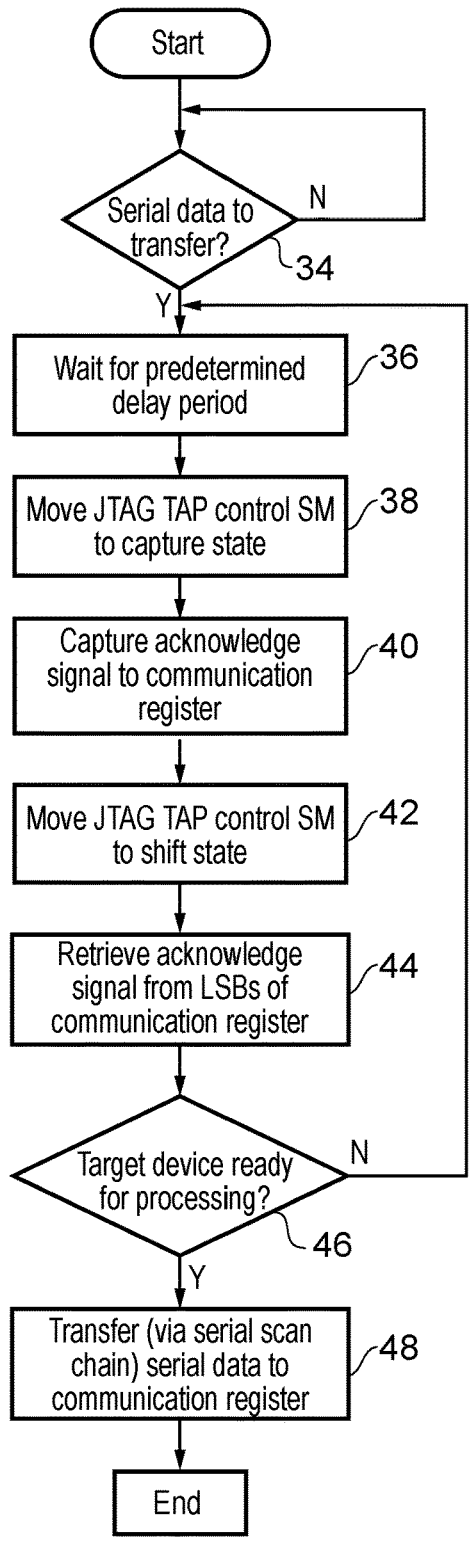
Figure 4:
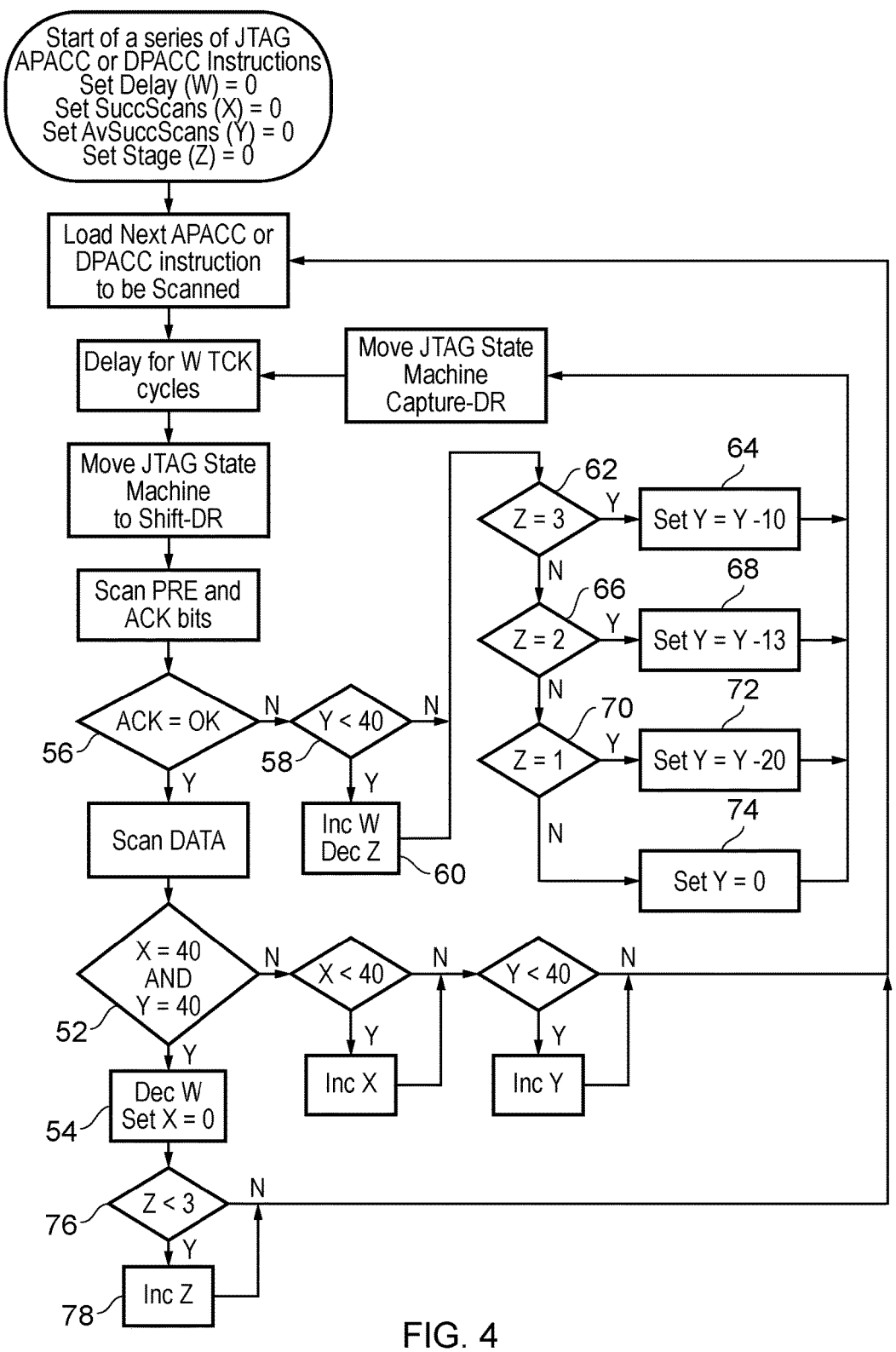

FIG. 1 schematically illustrates an apparatus for performing serial communication with a target device;

FIG. 2 schematically illustrates a portion of the target device including a communication register which is part of a serial scan chain and into and from which data to be transferred is serially clocked;

FIG. 3 is a flow diagram schematically illustrating control of serial communication in the system of FIG. 1; and FIG. 4 is a flow diagram schematically illustrating in more detail the control serial communication in a further particular example embodiment.

FIG. 1 schematically illustrates an apparatus for performing serial communication with a target device 4. More particularly, for example, the target device 4 comprises a system-on-chip integrated circuit including a processor core 6, a random access memory (RAM) 8, a debug access port 10 and JTAG serial scan chain communication circuitry 12. The JTAG serial scan chain communication circuitry 12 includes a communication control state machine 14 (e.g. a TAP control state machine). The apparatus for performing serial communication is in the form of test interface circuitry 2 which includes serial transfer circuitry 16, serial retrieval circuitry 18, delay control circuitry 20 and a programmable controller 22. The test interface circuitry 2 communicates with the target device 4 using serial communications in accordance with JTAG Standard techniques (e.g. IEEE 1149.1). It will be appreciated that the serial communication performed utilizes serial scan chains within the target device 4 into which serial data is clocked and from which serial data is retrieved. The communication control state machine 14 within the JTAG serial scan chain communication circuitry 12 serves to move the JTAG serial scan chain communication circuitry 12 between different states as will be familiar to those in this technical field. The states allow debug and diagnostic controlling instructions to be scanned into the JTAG serial scan chain communication circuitry 12 together with stimulus data to be applied to the target device 4. Furthermore, the system may be subsequently placed into a capture state in which signal values within the target device 4 may be captured into a serial scan chain so that they may be serially scanned out using the serial scan chain to the test interface circuitry 2 and have their values available for diagnostic and debug purposes.

In increasingly complex target devices 4, such as system-on-chip integrated circuits, it may be desired to download significant volumes of data into the target device 4, such as downloading a program or a dataset into the random access memory 8 which the processor core 6 will then manipulate and use. The result data from processing when generated may also be stored into the random access memory 8 and it may be desired to recover a large volume of result data via the serial communication channel provided by the scan chains back to the test interface circuitry 2. Such transfers of data (whether downloads to the target device 4, or uploads from the target device 4) may be performed using the serial transfer circuitry 16 to transfer the data (e.g. in 32-bit data words) to a communication register within the data access port 10. When such a transfer has taken place (whether a download or an upload), serial retrieval circuitry 18 within the test interface circuitry 2 serves to retrieve an acknowledge signal via the scan chain interface from the data access port 10 within the target device 4. This acknowledge signal indicates whether or not the target device in the form of the data access port is ready or unready to perform further processing (e.g. either receive a next data word from test interface circuitry 2 or provide a next data word for upload to the test interface circuitry 2). Since the acknowledge signal is returned via the serial scan chains, it is a relatively slow process to resample the acknowledge signal if the retrieved acknowledge signal indicates that the target device is unready.

The target device indicates its ready status using the acknowledge signal as either ready to perform processing or unready to perform processing. More particularly, as the serial communication takes place via a JTAG serial interface the communication control state machine 14 needs to be moved from a shift state in which the acknowledge signals which were just read as indicating unready were shifted out from the communication register, back to a capture state in which a new set of acknowledge signals may be captured into the communication register and then to the shift state again such that those newly captured acknowledge signals can be shifted out via the serial scan chain from the communication register to the test interface circuitry 2 in order to be checked again as to whether or not they indicate that the target device 2 is ready or unready for further processing.

The long latency associated with having to resample the acknowledge signal if an unready status is indicated by the acknowledge signal can significantly slow down the rate of data transfer which is achieved. More particularly, it is possible that a particular combination of target device 4 and test interface circuitry 2 may be such that, when a serial data transfer is performed and the acknowledge signal immediately sampled, the acknowledge signal returned will indicate unready whereas if a small delay had been introduced between the data transfer being performed and the acknowledge signal being sampled, the acknowledge signal would have reached the ready status and accordingly the long latency associated with having to resample the acknowledge signal could be avoided. For this reason, the delay control circuitry 20 within the test interface circuitry 2 serves to provide and control a predetermined delay period between the transfer of the serial data and the initiating of retrieval of the acknowledge signal. By dynamically adjusting this predetermined delay period in dependence upon the ready status of one or more retrieved acknowledge signals, the predetermined delay period can be adjusted to a value by which it just allows the acknowledge signals retrieved to be predominantly indicating that the target device is ready for further processing having just switched from a ready status in which the target device was unready for further processing. This additional predetermined delay period which is introduced into the communication process between the transfer of the serial data and the retrieval of the acknowledge signal might be conventionally through of as disadvantageous as it would slow the communication operation. However, in practice, as the introduced delay assists in avoiding the relatively longer delays associated with retrieving an acknowledge signal indicating that the target device is unready, the use of the predetermined delay period in fact results in many cases in an overall increase in data transfer throughput/speed.

As previously mentioned, the predetermined delay period can be controlled by the delay control circuitry 20 in dependence upon the ready status of one or more retrieved acknowledge signals. Generally speaking, if the retrieved acknowledge signals indicate that the target device is unready, then the predetermined delay period is too short. Conversely, if all of the retrieved acknowledge signals indicate that the target device is ready, then it is possible that the predetermined delay period being applied is too long and that greater performance could be achieved, whilst not incurring an excessive number of instances of resampling the acknowledge signal, by shortening the predetermined delay period. Accordingly, the delay control circuitry 20 operates to control the predetermined delay periods such that a proportion of retrieved acknowledge signals indicate that the target device is unready in accordance with a predetermined condition, e.g. that the proportion of the retrieved acknowledge signals indicating that the target device is unready is less than a non-zero predetermined proportion, e.g. 5%. The feedback control applied by the delay control circuitry 20 to the predetermined delay period may not be such that the proportion of the acknowledge signals retrieved corresponding to an unready status is zero, but that it is some non-zero predetermined portion; the gain from operating more quickly for those data transfers in which the acknowledge signal retrieved is ready outweighs the penalty incurred in having to resample the acknowledge signal when a small proportion of the retrieved acknowledge signals indicates that the target device is unready.

A typical pattern within the retrieved acknowledge signals is that the acknowledge signals indicating an unready state are periodically received separated by bursts of acknowledge signals indicating that the target device is ready. In order to actively seek improved performance continuously during operation, the delay control circuitry 20 may serve to detect when the predetermined delay period meets the predetermined condition for greater than a threshold time and in this case reduces the predetermined delay period until the predetermined condition is not met, whereupon the predetermined delay period is increased until the predetermined condition is met again. Thus, the delay control circuitry 20 continuously and actively seeks to reduce the predetermined delay period whenever possible.

It will be appreciated that the predetermined delay period in the present example embodiment is greater than the base time taken to move from the shift state to the capture state and back to the shift state as this is the minimum period following a data transfer either to or from the target device 4 by which an acknowledge signal may be retrieved. In practice, the predetermined delay period which is generated by the feedback control of the delay control circuitry 20 is normally a non-integer multiple of this base time. Without the deliberate introduction of the predetermined delay period, the time at which the sampling of the acknowledge signal was made following the data transfer would not be permitted to be non-integer multiples of the base time as a normal sample, fail, resample sequence would result in sampling of the acknowledge signal at times separated by the base time. Permitting the sampling to occur at non-integer multiples of the base time permits a reduced time until an acknowledge signal indicating a ready status of the target device is retrieved and accordingly permits an increased data transfer speed.

The programmable controller 22 within the test interface circuitry 2 is controlled via a general purpose computer 24. The general purpose computer 24 programs the programmable controller 22 to transfer data to and recover data from the target device 4 in accordance with desired diagnostic and debug operations.

FIG. 2 schematically illustrates the debug access port 10 in more detail. In particular, the debug access port 10 includes a communication register 26 which is part of a serial scan chain and accordingly is coupled via a serial scan chain input signal TDI and a serial scan chain output signal TDO to the JTAG serial scan chain communication circuitry 12. The communication register 26 permits further registers 28, 30 to be populated with data values. These data values may be, for example, a transaction address and a transaction payload for a data transaction which is then performed via a system bus, such as an AMBA system bus or an AMBA high performance system bus. In this way, for example, data values may be loaded into or from the RAM memory 8, e.g. via ITR and DTR debug registers (or potentially directly via the system bus).

FIG. 2 illustrates the communication register 26 as including acknowledge signal bits 32 in its least significant bit portion. These acknowledge signal bits 32 are set by the data access port 10 to indicate the ready status of the data access port 10 to receive or output a further data value to be transferred via the communication register 26. The acknowledge signal bits 32 can indicate that the communication register 26 is either ready to make such a further transfer or is unready to make such a further transfer. As the acknowledge signal bits 32 are the least significant bits within the communication register 26, they are the first to be recovered when the serial scan chain scans out the contents of the communication register 26. Accordingly, if these acknowledge signal bits 32 indicate an unready status, then further transfer can be halted.

FIG. 3 is a flow diagram schematically illustrating serial data communication. Processing waits at step 34 until there is serial data to transfer. Processing then proceeds to step 36 where the system waits for the current value of the predetermined delay period until processing proceeds to step 38 which moves the communication control state machine 14 to the capture state. At step 40 the latest value of the acknowledge signal bits 32 is captured into the communication register 26. Step 42 then moves the communication control state machine 14 to the shift state before step 44 retrieves the acknowledge signal in the form of the least significant bits from the communication register 26. Step 46 then determines whether or not the acknowledge signal bits 32 indicate that the target device 4 is ready for further processing (e.g. further communication via the communication register 26). If the target device 4 is not ready for further processing, then processing returns to step 36. If the target device is ready for further processing, then the transfer is then performed at step 48.

FIG. 4 is a flow diagram illustrating the control of the serial communication in more detail. In particular, the communication control illustrated is that associated with the retrieval of the acknowledge signal. The control utilizes a predetermined delay period of W cycles of the clock signal TCK which controls the JTAG serial scan chain communication circuitry 12. A variable X tracks the number of successive retrievals of the acknowledge signal which have indicated a ready state. A variable Y provides a long term average of the number of successive acknowledge signals which are returned indicating a ready state. Step 52 serves to identify the end of a sequence of, in this example case, 40 successive acknowledge signals indicating a ready state have been received and that the long term average of the success sequence value has also reached 40. In this case, the delay control circuitry 20 responds at step 54 by decreasing the predetermined delay period W as it may be that the predetermined delay period is set too long and that increased performance can be achieved without incurring receipt of an excessive number of acknowledge signals indicating an unready state.

Step 56 identifies when an acknowledge signal is received which indicates an unready state. When such an acknowledge signal is identified, processing proceeds to step 58 at which a determination is made as to whether the long term average of the runs of successively retrieved acknowledge signals indicating a ready state is less than 40. If the long term average is less than 40, then step 60 serves to increase the delay period as well as decrementing a state variable Z. Following step 58, and optionally step 60, processing proceeds to steps 62 to 74 at which the long term average value Y of the number of successful scans is reduced by an amount which is dependent upon the current value of the state variable Z. The action of the state variable Z in imposing a varying level of reduction in the long term average Y is that when the system has settled into a state in which a long sequence of successful sets of, in this example, 40 acknowledge signals which all indicate that the target device is ready have been received, then the long time average Y is reduced by less when a single acknowledge signal indicating the status as unready is received. Steps 76 and 78 serve to increment the state variable Z from a value of 0 to 3 upon occurrence of successfully received sequences of acknowledge signals indicating a ready state when the long term average Y is also 40.

Although illustrative embodiments have been described in detail herein with reference to the accompanying drawings, it is to be understood that the claims are not limited to those precise embodiments, and that various changes, additions and modifications can be effected therein by one skilled in the art without departing from the scope and spirit of the appended claims. For example, various combinations of the features of the dependent claims could be made with the features of the independent claims.

The invention claimed is:

1. Apparatus for performing serial communication with a target device, said apparatus comprising:
   serial transfer circuitry to transfer serial data to or from said target device;
   serial retrieval circuitry to retrieve an acknowledge signal from said target device, said serial retrieval circuitry initiating retrieval of said acknowledge signal after a predetermined delay period following said transfer of said serial data, said acknowledge signal indicating a ready status of said target device as one of:
      said target device is ready to perform processing; and
      said target device is unready to perform said processing; and
   delay control circuitry to control said predetermined delay period in dependence upon said ready status of one or more retrieved acknowledge signals.

2. Apparatus as claimed in claim 1, wherein when said acknowledge signal indicates said target device is unready to perform said further processing, said retrieval circuitry retrieves another acknowledge signal from said target device until said acknowledge signal indicates that said target device is ready to perform processing.

3. Apparatus as claimed in claim 1, wherein said delay control circuitry controls a duration of said predetermined delay period such that a proportion of retrieved acknowledge signals indicating said target device is unready to perform said processing meets a predetermined condition.

4. Apparatus as claimed in claim 1, wherein said predetermined condition is that said proportion is less than a predetermined non-zero proportion.

5. Apparatus as claimed in claim 1, wherein said delay control circuitry detects when said predetermined delay period meets said predetermined condition for greater than a threshold time and reduces said predetermined delay period until said predetermined condition is not met, whereupon said predetermined delay period is increased until said predetermined condition is again met.

6. Apparatus as claimed in claim 1, wherein said target device is an integrated circuit and said serial data is serial test data.

7. Apparatus as claimed in claim 6, wherein said target device comprises a communication control state machine and said apparatus further comprises a state machine controller to generate serial control signals to control said communication control state machine within said target apparatus to move between a capture state in which a new value of said acknowledge signal is captured and a shift state in which said new value of said acknowledge signal is available to be downloaded by a serial download circuitry.

8. Apparatus as claimed in claim 7, wherein said predetermined delay period is greater than a base time taken to move from said shift state to said capture state and back to said shift state.

9. Apparatus as claimed in claim 8, wherein said predetermined delay period is a non-integer multiple of said base time.

10. Apparatus as claimed in claim 6, wherein said serial data is transferred to a communication register within said integrated circuitry and said acknowledge signal indicates that said communication register is ready to transfer a next instance of serial data.

11. Apparatus as claimed in claim 10, wherein said serial data within said communication register forms part of a data transaction to be performed within said integrated circuit.

12. Apparatus as claimed in claim 11, wherein said data transaction is part of one of:
 a download of a plurality of data values to memory addresses of a memory address space of said integrated circuit; and
 an upload of a plurality of data values from memory addresses of said memory address space of said integrated circuit.

13. Apparatus as claimed in claim 10, wherein said communication register is part of a serial scan chain coupled to apparatus.

14. Apparatus as claimed in claim 6, wherein said apparatus communicates with said integrated circuit via an IEEE 1149.1 interface.

15. Apparatus for performing serial communication with a target device, said apparatus comprising:
 serial transfer means for transferring serial data to or from said target device;
 serial retrieval means for retrieving an acknowledge signal from said target device, said serial retrieval means initiating retrieval of said acknowledge signal after a predetermined delay period following said transfer of said serial data, said acknowledge signal indicating a ready status of said target device as one of:
  said target device is ready to perform processing; and
  said target device is unready to perform said processing; and
 delay control means for controlling said predetermined delay period in dependence upon said ready status of one or more retrieved acknowledge signals.

16. A method of performing serial communication with a target device, said method comprising the steps of:
 transferring serial data to or from said target device;
 initiating retrieval of an acknowledge signal from said target device after a predetermined delay period following said transfer of said serial data, said acknowledge signal indicating a ready status of said target device as one of:
  said target device is ready to perform processing; and
  said target device is unready to perform said processing; and
 controlling said predetermined delay period in dependence upon said ready status of one or more retrieved acknowledge signals.

* * * * *